(12) United States Patent
Lee et al.

(10) Patent No.: US 7,956,947 B2
(45) Date of Patent: Jun. 7, 2011

(54) THIN FILM TRANSISTOR ARRAY SUBSTRATE HAVING IMPROVED ELECTRICAL CHARACTERISTICS AND METHOD OF MANUFACTURING THE SAME

(75) Inventors: Je-Hun Lee, Seoul (KR); Kap-Soo Yoon, Seoul (KR); Kyung-Seok Son, Seoul (KR); Do-Hyun Kim, Seoul (KR); Chang-Oh Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 324 days.

(21) Appl. No.: 12/355,646

(22) Filed: Jan. 16, 2009

(65) Prior Publication Data
US 2009/0184315 A1   Jul. 23, 2009

(30) Foreign Application Priority Data
Jan. 18, 2008  (KR) .................. 10-2008-0005833

(51) Int. Cl.
*G02F 1/136*   (2006.01)
*G02F 1/13*   (2006.01)
*H01L 29/786*   (2006.01)
*H01L 21/336*   (2006.01)

(52) U.S. Cl. ............ 349/43; 349/42; 349/187; 349/138; 349/139; 349/158; 257/43; 257/E29.296; 257/E21.411; 438/30; 438/104

(58) Field of Classification Search ............... 349/43, 349/42, 46, 187, 122, 138, 139, 135, 158, 349/147, 110; 438/104, 30; 257/43, E29.296, 257/E21.411
See application file for complete search history.

(56) References Cited

U.S. PATENT DOCUMENTS

| | | | |
|---|---|---|---|
| 6,969,889 B2 * | 11/2005 | Cho et al. | 257/347 |
| 7,396,695 B2 * | 7/2008 | Cho et al. | 438/30 |
| 2004/0232443 A1 * | 11/2004 | Cho et al. | 257/202 |
| 2009/0184315 A1 * | 7/2009 | Lee et al. | 257/43 |

* cited by examiner

*Primary Examiner* — Brian M Healy
(74) *Attorney, Agent, or Firm* — Innovation Counsel LLP

(57) ABSTRACT

A thin film transistor array substrate, which can have high mobility of charge and can achieve uniform electrical characteristics for wide display devices, and a method of manufacturing the thin film transistor array substrate, are provided. The thin film transistor array substrate includes an oxide semiconductor layer having a channel and formed on an insulating substrate, a gate electrode overlapping the oxide semiconductor layer, a gate insulating film disposed between the oxide semiconductor layer and the gate electrode, and a passivation film formed on the oxide semiconductor layer and the gate electrode. At least one of the gate insulating film and the passivation film contains fluorine-containing silicon.

20 Claims, 5 Drawing Sheets

US 7,956,947 B2

THIN FILM TRANSISTOR ARRAY SUBSTRATE HAVING IMPROVED ELECTRICAL CHARACTERISTICS AND METHOD OF MANUFACTURING THE SAME

CROSS REFERENCE TO RELATED APPLICATION

This application claims priority from Korean Patent Application No. 10-2008-0005833 filed on Jan. 18, 2008 in the Korean Intellectual Property Office, the disclosure of which is incorporated herein by reference in its entirety.

BACKGROUND OF THE INVENTION

1. Field of the Invention

The present invention relates to a thin film transistor array substrate and a method of manufacturing the same, and more particularly relates to a thin film transistor array substrate that improves electrical characteristics of an oxide semiconductor layer and a method of manufacturing the same.

2. Description of the Related Art

A liquid crystal display device, one of the most widely used types of flat panel displays in recent years, typically includes two substrates with electrodes, and a liquid crystal layer between the substrates. The substrates adjust the amount of light passing through the liquid crystal layer by re-arranging liquid crystal molecules in the liquid crystal layer using a voltage applied to the electrodes.

In many contemporary liquid crystal display devices, an electric field generating electrode is provided to first and second substrates, respectively. In this configuration, a plurality of pixel electrodes are arranged in a matrix form on the first substrate (i.e., a thin film transistor array substrate), and one common electrode covers the entire surface of the second substrate.

In this liquid crystal display device, images are displayed by applying an individual voltage to each pixel electrode. To accomplish this, a thin film transistor, a three-terminal element switching the voltages that are applied to the pixel electrodes, is connected with the pixel electrodes. Also connected to the pixel electrodes are a plurality of wires including gate lines that transmit signals for controlling the thin film transistor, and data lines that transmit voltages for the pixel electrodes. These devices are all formed on the substrate.

This switching element can be divided into an amorphous silicon thin film transistor and a polycrystalline silicon thin film transistor, depending on the materials that form the channel region. As for the amorphous silicon thin film transistor, the mobility of charge is low at about 0.5 $cm^2/Vs$, but it can achieve uniform electrical characteristics for wide display devices. Further, as for the polycrystalline silicon thin film transistor, the mobility of charge is high at about a few hundred $cm^2/Vs$, but it is difficult to achieve uniform electrical characteristics for wide display devices.

SUMMARY OF THE INVENTION

An object of the invention is to provide a thin film transistor array substrate that has high mobility of charge and can achieve uniform electrical characteristics for wide display devices.

Another object of the invention is to provide a method of manufacturing the thin film transistor array substrate.

However, the aspects, features and advantages of the present invention are not restricted to the ones set forth herein. The above and other aspects, features, objects, and advantages of the present invention will become more apparent to one of ordinary skill in the art to which the present invention pertains by referencing a detailed description of the present invention given below.

According to an exemplary embodiment of the present invention, a thin film transistor array substrate includes an oxide semiconductor layer, a gate electrode overlapping the oxide semiconductor layer, a gate insulating film disposed between the oxide semiconductor layer and the gate electrode, and a passivation film formed on the oxide semiconductor layer and the gate electrode. At least one of the gate insulating film and the passivation film contains fluorine-containing silicon.

According to another exemplary embodiment of the present invention, a method of manufacturing a thin film transistor array substrate includes forming a thin film transistor structure having an oxide semiconductor layer, a gate electrode overlapping the oxide semiconductor layer, and a gate insulating film therebetween, and forming a passivation film on the oxide semiconductor layer and the gate electrode. At least one of the gate insulating film and the passivation film contains fluorine-containing silicon.

BRIEF DESCRIPTION OF THE DRAWINGS

The above and other features and advantages of the present invention will become more apparent by describing in detail embodiments thereof with reference to the attached drawings in which.

DETAILED DESCRIPTION OF EMBODIMENTS OF THE INVENTION

Figure 1A:
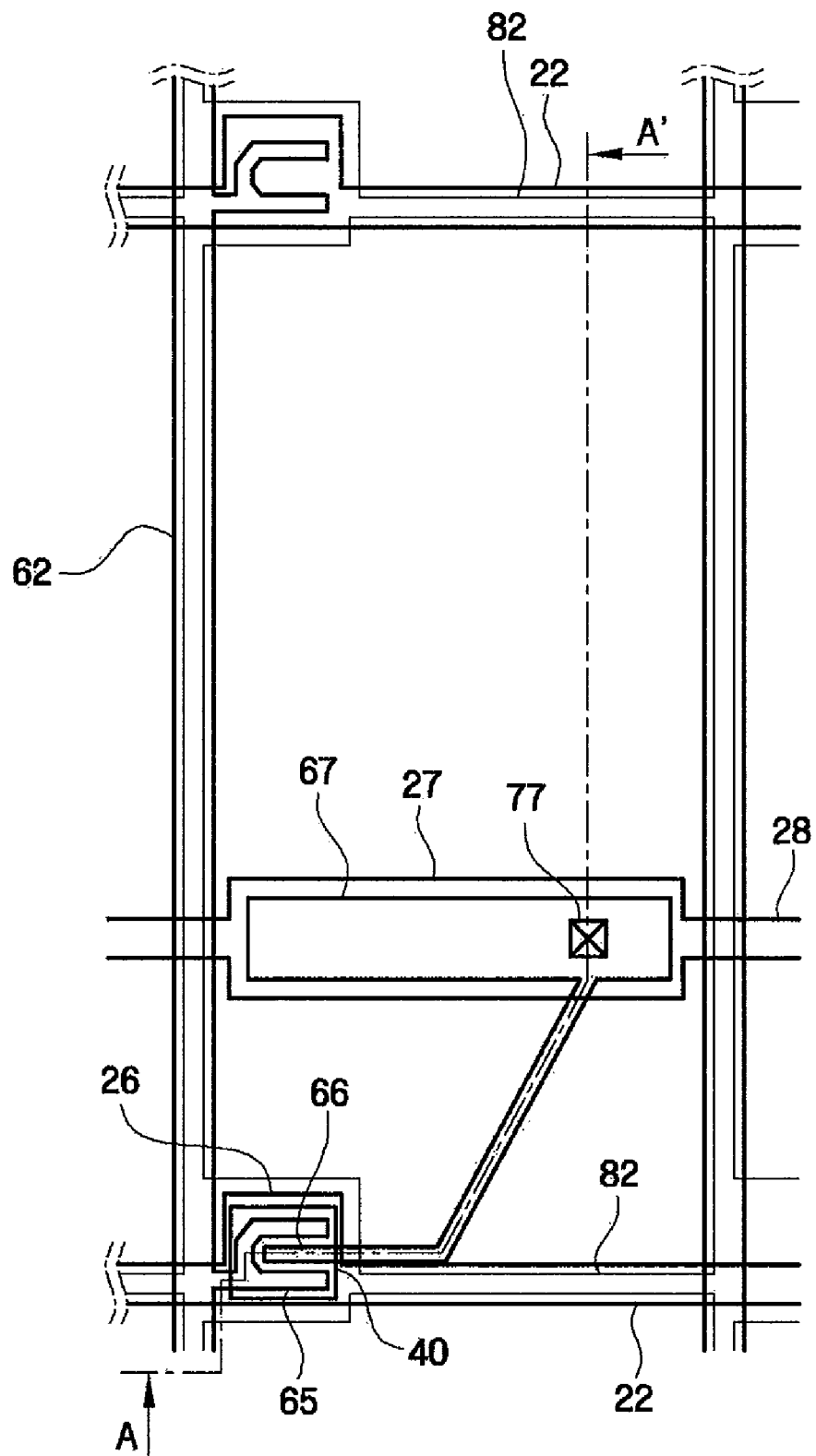
FIG. 1A is a layout of a thin film transistor array substrate according to a first embodiment of the invention.

Advantages and features of the present invention and methods of accomplishing the same may be understood more readily by reference to the following detailed description and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the invention. Accordingly, the exemplary views may be modified depending on manufacturing technologies and/or tolerances. Therefore, the embodiments of the invention are not limited to those shown in the views, but include modifications in configuration formed on the basis of manufacturing processes. Additionally, regions exemplified in figures have schematic properties and shapes of regions shown in figures exemplify specific shapes of regions of elements and not limiting aspects of the invention.

Figure 1B:
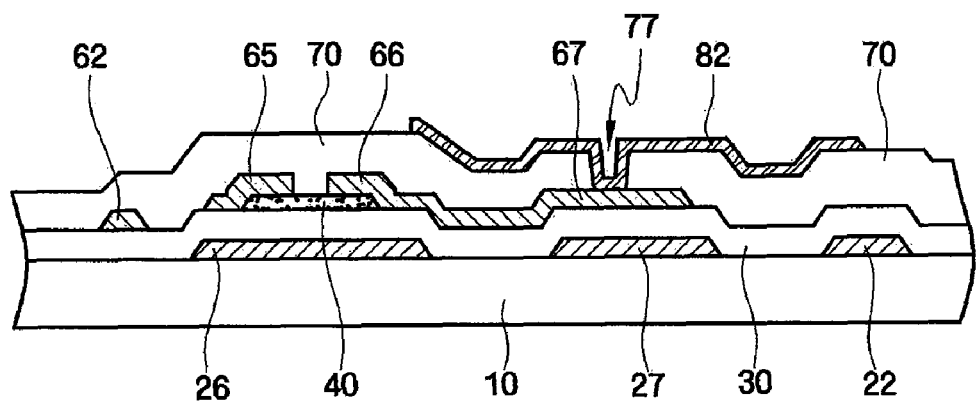
FIG. 1B is a cross-sectional view of the thin film transistor array substrate of FIG. 1A, taken along the line A-A' of FIG. 1A.

A thin film transistor array substrate according to a first embodiment of the invention is described in detail hereafter with reference to FIGS. 1A and 1B. FIG. 1A is a layout of a thin film transistor array substrate according to a first embodiment of the invention and FIG. 1B is a cross-sectional view of the thin film transistor array substrate of FIG. 1A, taken along the line A-A'.

Referring to FIGS. 1A and 1B, a gate wiring 22, 26 that transmits gate signals is formed on an insulating substrate 10. The gate wiring 22, 26 includes a gate line 22 that transversely extends, and a gate electrode 26 of a thin film transistor that is a protrusion connected with the gate line 22.

Further, a storage wiring 27, 28 that transmits a storage voltage is formed on the insulating substrate 10. The storage wiring 27, 28 includes a storage line 28 that is substantially parallel with the gate line 22 across a pixel region, and a storage electrode 27 that has a width larger than the storage line 28 and that is connected to the storage line 28. The storage electrode 27 forms a storage capacitor that improves performance of charge preservation of the pixel, overlapping a drain electrode extender 67 connected with a pixel electrode 28 (described below). The shape and arrangement of the storage electrode 27 and the storage line 28 may be modified into various types, and when storage capacitance that is generated by the overlap of the pixel electrode 82 and the gate line 22 is sufficient, the storage electrode 27 and the storage line 28 may not be provided.

The gate wiring 22, 26 and the storage wiring 27, 28 may be formed of an aluminum-based metal, such as aluminum (Al) or an aluminum alloy, a silver-based metal, such as silver (Ag) or a silver alloy, a copper-based metal, such as copper (Cu) or a copper alloy, a molybdenum-based metal, such as molybdenum (Mo) or a molybdenum alloy, chrome (Cr), Titanium (Ti), or tantalum (Ta). Further, the gate wiring 22, 26 and the storage wiring 27, 28 may each have a multi-film structure including two conductive films with different physical properties (not shown). One of the two conductive films can be formed of a low-resistivity metal, such as an aluminum-based metal, silver-based metal, or copper-based metal, to decrease signal delay or voltage drop of the gate wiring 22, 26 and the storage wiring 27, 28. On the other hand, the other conductive film can be formed of another material, particularly a material that has good adhesiveness to ZnO (Zinc Oxide), ITO (Indium Tin Oxide), or IZO (Indium Zinc Oxide), such as a molybdenum-based metal, chrome, titanium, and tantalum. A lower chrome film with an upper aluminum film and a lower aluminum film with an upper molybdenum film may be good examples of the multi-film structure. However, the present invention is not limited to this configuration, and the gate wiring 22, 26 and the storage wiring 27, 28 may be formed of a variety of metals and conductive materials.

A gate insulating film 30 is formed on the gate wiring 22, 26 and the insulating substrate 10. The gate insulating film 30 may be formed of fluorine-containing silicon. The fluorine-containing silicon may be fluorine-containing silicon nitride, fluorine-containing silicon oxide, or fluorine-containing silicon oxynitride, such as SiOF, SiNF, SiONF, or SiOCF. When the gate insulating film 30 is formed of fluorine-containing silicon, a low level of hydrogen is contained the gate insulating film 30, such that it is possible to prevent deterioration of the electrical characteristics of an oxide semiconductor layer 40.

The oxide semiconductor layer 40, which can be an oxide of a material selected from Zn, In, Ga, Sn, and their combination, is formed on the gate insulating film 30. For example, for the oxide semiconductor layer 40, a mixed oxide, such as ZnO, InZnO, InGaO, InSnO, ZnSnO, GaSnO, GaZnO, or GaInZnO, may be used. The oxide semiconductor layer 40 can be two to one hundred times larger in the effective mobility of charge than hydrogenated amorphous silicon and have a $10^5$ to $10^8$ on/off current ratio, such that its semiconductor characteristics are good. Further, for the oxide semiconductor layer 40, the band gap is about 3.0 to 3.5 eV, such that photocurrent does not leak with respect to visible light. Therefore, it is possible to prevent a second afterimage of an oxide thin film transistor and increase the aperture ratio of the liquid crystal display device as well, because no light shielding film need be provided under the oxide thin film transistor. The group 3, 4, 5 elements or transition elements in the periodic table may be additionally included to improve the characteristics of the oxide semiconductor. Further, the materials for the oxide semiconductor layer 40 have good ohmic contact characteristics to data wiring 62, 65, 66, 67 (described below), such that an ohmic contact layer is not needed and it is possible to reduce the process time. Further, the oxide semiconductor layer 40 is in amorphous state, but has high effective mobility of charge, and it is possible to apply the manufacturing process for amorphous silicon to the oxide semiconductor layer. Therefore, the oxide semiconductor layer may be applied to wide display devices.

For the oxide thin film transistor of this embodiment, the oxide semiconductor layer 40 and the data wiring 62, 65, 66, 67 are different in pattern. However, when a four-sheet mask process is applied, the oxide semiconductor layer 40 may be patterned substantially the same as the data wiring 62, 65, 66, 67, except for the channel region of the oxide thin film transistor, because the oxide semiconductor layer 40 and the data wiring 62, 65, 66, 67 are patterned by one etching mask. Although a structure formed by a five-sheet mask process is exemplified in this embodiment, it is apparent to the person skilled in the art that other processes, such as three-sheet or four-sheet mask processes, may be used without departing from the primary aspects of the present invention.

The data wiring 62, 65, 66, 67 is formed on the oxide semiconductor layer 40 and the gate insulating film 30. The data wiring 62, 65, 66, 67 includes a data line 62 that is longitudinally formed across the gate line 22 and defines a pixel, and a source electrode 65 that branches off from the data line 62 and extends to the upper portion of the oxide semiconductor layer 40. The data wiring 62, 65, 66, 67 also includes a drain electrode 66 that is separated from the source electrode 65 (facing the source electrode 65, across the gate electrode 26 or the channel of the oxide thin film transistor, on the oxide semiconductor layer 40), and an electrode extender 67 that has a large area and extends from the drain electrode 66, overlapping the storage electrode 27.

The data wiring 62, 65, 66, 67 may be formed of a material that forms an ohmic contact by contacting directly with the oxide semiconductor layer 40. When the data wiring 62, 65, 66, 67 is formed of a material that has a work function smaller than the material of the oxide semiconductor layer 40, ohmic contact may be made between the two layers. Therefore, when the work function of the oxide semiconductor layer 40 is above approximately 5 eV, for example, about 5.1 to 5.3 eV, the data wiring 62, 65, 66, 67 may be formed of a material with about 5.3 eV or less work function. Further, it may be appropriate that the difference in work function of the data wiring 62, 65, 66, 67 and the oxide semiconductor layer 40 is about 1.5 eV or less, in order to improve characteristics of contact resistance. Therefore, for the ohmic contact with the oxide semiconductor layer 40, the data wiring 62, 65, 66, 67, as shown in the following Table 1, may be formed of a single film or multi-film of Ni, Co, Ti, Ag, Cu, Mo, Al, Be, Nb, Au, Fe, Se, or Ta. Furthermore, alloys containing the above metals and one or more elements selected from Ti, Zr, W, Ta, Nb, Pt, Hf, O, N may be applied.

Work functions of materials used for the data wiring 62, 65, 66, 67 are shown in Table 1.

TABLE 1

| Metal | Ni | Co | Ti | Ag | Cu | Mo |
|---|---|---|---|---|---|---|
| Work Function(eV) | 5.01 | 5.0 | 4.7 | 4.73 | 4.7 | 4.5 |
| Metal | Al | Be | Nb | Au | Fe | Se |
| Work Function(eV) | 4.08 | 5.0 | 4.3 | 5.1 | 4.5 | 5.11 |

On the other hand, when the oxide semiconductor layer 40 directly contacts a metal, such as Al, Cu, Ag, the characteristics of the oxide thin film transistor with the data wiring 62, 65, 66, 67 formed on the above metals and/or the characteristics of ohmic contact with ITO or IZO that is generally used for the pixel electrode 82 may be deteriorated by inter-reaction and diffusion. Therefore, the data wiring 62, 65, 66, 67 may be formed in a double film or triple film structure.

When the data wiring 62, 65, 66, 67 is formed of Al or an alloy of Al and one of Nd, Sc, C, Ni, B, Zr, Lu, Cu, and Ag, a multi-film of a double film on and/or beneath Al or Al alloy may be applied. For example, a double film, such as Mo(Mo alloy)/Al(Al alloy), Ti(Ti alloy)/Al(Al alloy), Ta(Ta alloy)/Al (Al alloy), Ni(Ni alloy)/Al(Al alloy), and Co(Co alloy)/Al(Al alloy), or a triple film, such as Ti(Ti alloy)/Al(Al alloy)/Ti(Ti alloy), Ta(Ta alloy)/Al(Al alloy)/Ta(Ta alloy), Ti(Ti alloy)/Al (Al alloy)/TiN, Ta(Ta alloy)/Al(Al alloy)/TaN, Ni(Ni alloy)/ Al(Al alloy)/Ni(Ni alloy), Co(Co alloy)/Al(Al alloy)/Co(Co alloy), and Mo(Mo alloy)/Al(Al alloy)/Mo(Mo alloy), may be applied. Mo, W, Nb, Zr, V, O, and N, etc. may be added in the above alloys.

On the other hand, when the data wiring 62, 65, 66, 67 is formed of Cu or a Cu alloy, because the characteristics of ohmic contact between the data wiring 62, 65, 66, 67 and the pixel electrode 82 are not practically affected, the data wiring 62, 65, 66, 67 may be formed in a double film with a film containing Mo, Ti, or Ta between the oxide semiconductor layer 40 and a film of Cu or Cu alloy. For example, a double film, such as Mo(Mo alloy)/Cu, Ti(Ti alloy)/Cu, TiN(TiN alloy)/Cu, Ta(Ta alloy)/Cu, or TiOx/Cu may be applied.

The source electrode 65 overlaps at least a portion of the oxide semiconductor layer 40 and the drain electrode 66 overlaps at least a portion of the oxide semiconductor layer 40, facing the source electrode 65 across the channel of the oxide thin film transistor.

The drain electrode extender 67 overlaps the storage electrode 27 and a storage capacitor is formed by the drain electrode extender 67, the storage electrode 27, and the intervening gate insulating film 30 formed between them. The drain electrode extender 67 may not be formed when the storage electrode 27 is not formed.

A passivation film 70 is formed on the data wiring 62, 65, 66, 67 and exposed portions of the oxide semiconductor layer 40. Because the passivation film 70 is in contact with the oxide semiconductor layer 40, similar to the gate insulating film 30, it may be formed of fluorine-containing silicon. The fluorine-containing silicon may be fluorine-containing silicon nitride, fluorine-containing silicon oxide, or fluorine-containing silicon oxynitride, such as SiOF, SiNF, SiONF, or SiOCF. When fluorine-containing silicon is used for the passivation film 70, a low level of hydrogen is contained the passivation film 70, such that it is possible to prevent deterioration of the electrical characteristics of the oxide semiconductor layer 40.

A contact hole 77 that exposes the drain electrode extender 67 is formed through the passivation film 70. The pixel electrode 82 is formed on the passivation film 70, electrically connected with the drain electrode 66 through the contact hole 77. The pixel electrode 82 may be formed of a transparent conductive material, such as ITO (Indium Tin Oxide) or IZO (Indium Zinc Oxide), or a reflective conductive material, such as aluminum.

When a data voltage is applied, the pixel electrode 82 generates an electric field together with the common electrode (not shown) of the upper substrate (also not shown) facing the thin film transistor array substrate, such that the liquid crystal molecules are arranged in a predetermined pattern between the pixel electrode 82 and the common electrode.

In the above embodiments, the insulating films contacting the oxide semiconductor layer 40, i.e., both the gate insulating film 30 and passivation film 70, are formed of fluorine-containing silicon, but the invention is not limited to this material. In particular, one of the gate insulating film 30 and passivation film 70 may also be formed of fluorine-containing silicon and the other may be formed of silicon nitride or silicon oxide.

A method of producing fluorine-containing silicon for the insulating film contacting the oxide semiconductor layer 40, i.e., the gate insulating film 30 or the passivation film 70, will now be described. Fabricating these films of fluorine-containing silicon helps to prevent deterioration of the electrical characteristics of the oxide semiconductor layer 40.

Hydrogen generally deoxidizes oxide, generating oxygen vacancy in the oxide. This oxygen vacancy increases the carrier concentration of the channel of the oxide semiconductor layer 40. Therefore, as a high level of hydrogen is contained in the gate insulating film 30 or the passivation film 70, the carrier concentration increases, such that the threshold voltage Vth of the oxide thin film transistor may shift in the negative direction, rendering the oxide semiconductor layer 40 conductive. Therefore, it is important to reduce the level of hydrogen in the gate insulating film 30 and the passivation film 70, because they are in contact with the oxide semiconductor layer 40.

According to an embodiment of the invention, a fluorine-containing silicon may be produced by the reaction of a first reaction gas containing Si and F without hydrogen, and a second reaction gas containing O, N, or F, also without hydrogen. This allows for production of fluorine-containing silicon with no hydrogen, preventing deterioration of electrical characteristics of the oxide semiconductor layer 40 (i.e., preventing the oxide semiconductor layer 40 from becoming a conductive layer). For example, the first reaction gas includes SiF, $SiF_2$, $SiF_3$, or $SiF_4$, etc., and the second reaction gas includes NO, $N_2O$, $O_2$, NF, $NF_2$, or $NF_3$.

The following reaction formulae 1 to 4 represent examples of producing fluorine-containing silicon using a first reaction gas containing Si and F and a second reaction gas containing O, N, or F.

$$2SiF_4(g)+2N_2O(g)\rightarrow 2SiOF(s)+2N_2(g)+3F_2(g) \quad \text{[Reaction Formula 1]}$$

$$2SiF_4(g)+2N_2O(g)\rightarrow 2SiONF(s)+N_2(g)+3F_2(g) \quad \text{[Reaction Formula 2]}$$

$$2SiF_4(g)+2O_2(g)\rightarrow 2SiOF(s)+O_2(g)+3F_2(g) \quad \text{[Reaction Formula 3]}$$

$$2SiF_4(g)+2CO_2(g)\rightarrow 2SiOCF(s)+O_2(g)+3F_2(g) \quad \text{[Reaction Formula 4]}$$

The following reaction formulae 5 and 6 represent examples of producing fluorine-containing silicon, in which a first reaction gas contains fluorine (F) and a second reaction gas contains hydrogen (H).

$$2SiF_4(g)+2NH_3(g)\rightarrow 2SiF(s)+3H_2(g)+3F_2(g) \quad \text{[Reaction Formula 5]}$$

$$SiH_4(g)+NF_3(g)\rightarrow SiNF(s)+2N_2(g)+F_2(g) \quad \text{[Reaction Formula 6]}$$

Referring to Reaction Formula 5, for example, the first reaction gas contains SiF, $SiF_2$, $SiF_3$, or $SiF_4$ and the second reaction gas contains $NH_2$ or $NH_3$. Further, referring to Reaction Formula 6, for example, the first reaction gas contains NF, $NF_2$, or $NF_3$ and the second reaction gas contains $SiH_4$.

When the gate insulating film 30 is formed of fluorine-containing silicon as described above, the level of hydrogen in the gate insulating film 30 is prevented from increasing and the electrical characteristics of the oxide semiconductor layer 40 do not deteriorate. Further, when the passivation film 70 is formed of fluorine-containing silicon, the level of hydrogen in the passivation film 70 is also prevented from increasing and the electrical characteristics of the oxide semiconductor layer 40 do not deteriorate.

A method of manufacturing a thin film transistor array substrate according to a first embodiment of the invention is described hereafter in detail with reference to FIGS. 1A to 6. In particular, FIGS. 2 to 6 are cross-sectional views of sequential processes illustrating a method of manufacturing a thin film transistor array substrate, or structure, according to a first embodiment of the invention.

Figure 2:
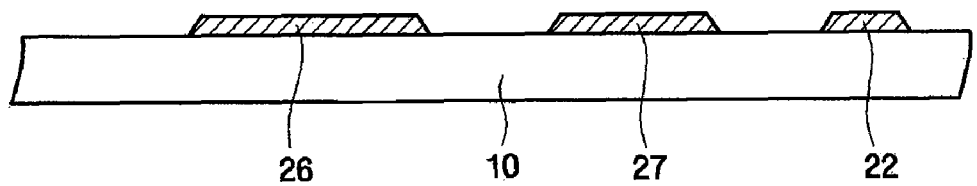
FIGS. 2 to 6 are cross-sectional views of processes sequentially illustrating a method of manufacturing the thin film transistor array substrate according to the first embodiment of the invention.

The first process is to form the gate line 22, gate electrode 26, storage electrode 27, and storage line 28 on the insulating substrate 10 as shown in FIGS. 1A and 2.

The insulating film 10 may be formed of a glass, such as soda lime glass or boro-silicate glass, or a plastic. Sputtering may be used to form the gate wiring 22, 26. Wet etching or dry etching may be used for patterning the gate wiring 22, 26. Etchant, such as phosphoric acid, nitric acid, or acetic acid, may be used for the wet etching, whereas a chlorine-containing etching gas, such as $Cl_2$ or $BCl_3$, may be used for the dry etching.

Figure 3:
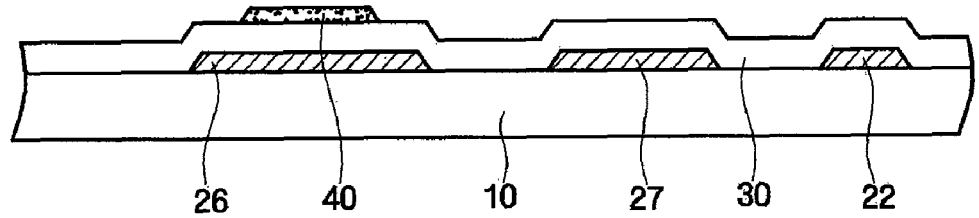

Referring to FIGS. 1A and 3, the gate insulating film 30 (as above, made of fluorine-containing silicon) is formed on the insulating substrate 10 and gate wiring 22, 26 by PECVD (Plasma Enhanced Chemical Vapor Deposition) or reactive sputtering. Further, the oxide semiconductor layer 40 is formed on the gate insulating film 30.

Figure 4:
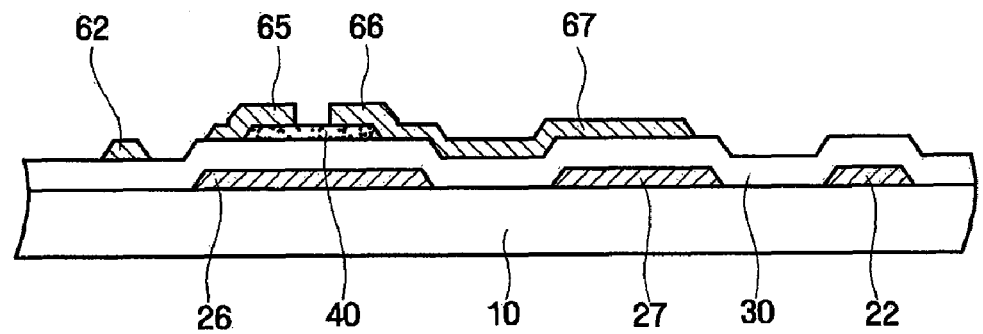

Referring to FIGS. 1A and 4, the data wiring 62, 65, 66, 67 is formed on the gate insulating film 30 and oxide semiconductor layer 40, by sputtering for example. The source electrode 65 and drain electrode 66 are spaced at a predetermined distance from the gate electrode 26, facing each other, and the electrode extender 67 extends from the drain electrode 66 to overlap the storage electrode 27.

Figure 5:
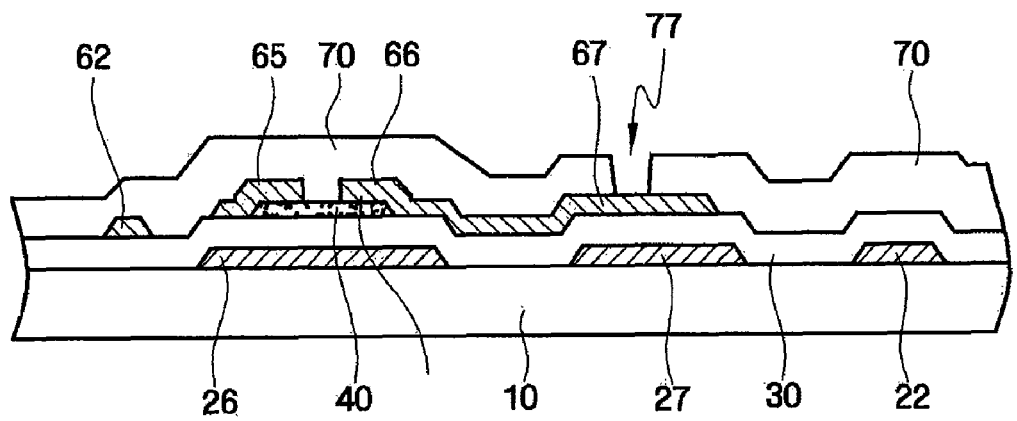

As shown in FIG. 5, the passivation film 70 of fluorine-containing silicon is formed by PECVD or reactive sputtering. The contact hole 77 that exposes the drain electrode extender 67 is formed by patterning the passivation film 70 using photo etching.

Figure 6:
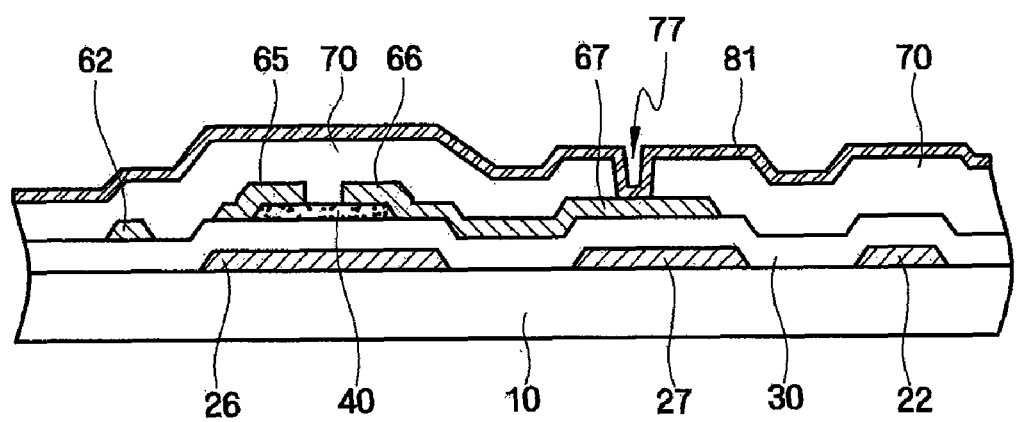

Referring to FIG. 6, a conductive film 81 for the pixel electrode is formed on the passivation film 70. The conductive film 81 is connected to a portion of the data wiring 62, 65, 66, 67, and may be formed of a transparent conductive material such as ITO (Indium Tin Oxide) or IZO (Indium Zinc Oxide), or a reflective conductive material such as aluminum.

Referring to FIGS. 1B and 6, the pixel electrode 82 is formed by patterning the conductive film 81.

Figure 7:
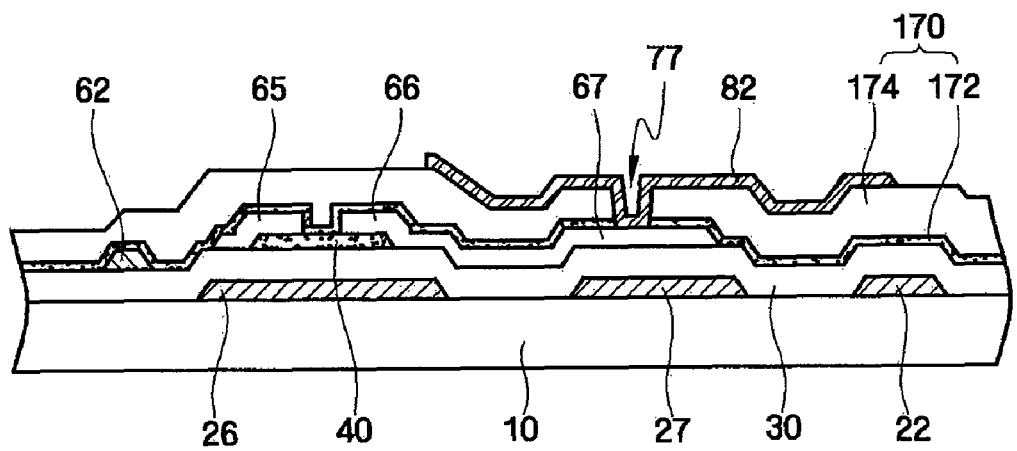
FIG. 7 is a cross-sectional view of a thin film transistor array substrate according to a second embodiment of the invention.

A thin film transistor array substrate according to a second embodiment of the invention is described hereafter in detail with reference to FIG. 7. FIG. 7 is a cross-sectional view of a thin film transistor array substrate according to a second embodiment of the invention. For the sake of convenience, components having the same function as previously-described components are represented by the same reference numerals, and accordingly are not described.

Referring to FIG. 7, a passivation film 170 is composed of a lower passivation film 172 that contacts the oxide semiconductor layer 40, and an upper passivation film 174 that contacts the pixel electrode 82 (and does not contact the oxide semiconductor layer 40). The lower passivation film 172 may be formed of fluorine-containing silicon to keep the electrical characteristics of the oxide semiconductor layer 40. The upper passivation film 174 may be formed of an inorganic material containing silicon nitride or silicon oxide, an organic material having good planarization and photosensitivity, or a low dielectric constant material that is formed by PECVD, such as a-Si:C:O or a-Si:O:F. It is possible to prevent reduction of the hydrogen in the upper passivation film 174 with the oxide semiconductor layer 40 by forming the lower passivation film 172 in a thickness of about 3 nm or more.

Figure 8:
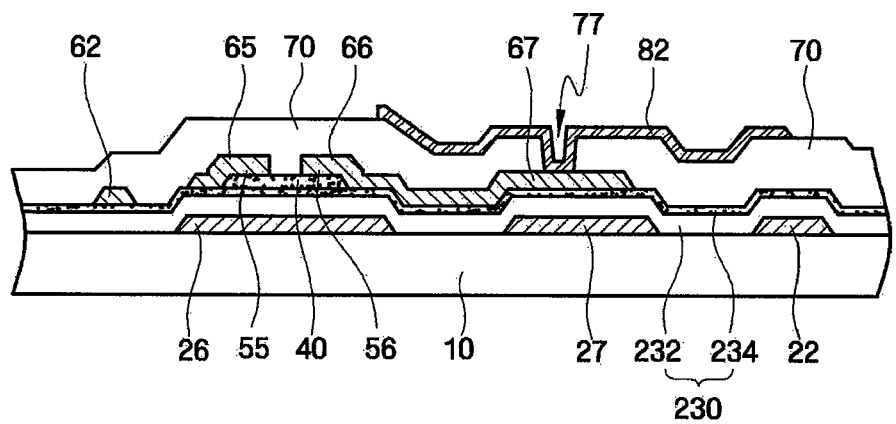
FIG. 8 is a cross-sectional view of a thin film transistor array substrate according to a third embodiment of the invention.

A thin film transistor array substrate according to a third embodiment of the invention is described hereafter in detail with reference to FIG. 8. FIG. 8 is a cross-sectional view of a thin film transistor array substrate according to a third embodiment of the invention. For the sake of convenience, components having the same function as previously-described components are represented by the same reference numerals, and accordingly are not described.

Referring to FIG. 8, a gate insulating film 230 is composed of a lower insulating film 232 that contacts the gate line 22 (and does not contact the oxide semiconductor layer 40) and an upper insulating film 234 that contacts the oxide semiconductor layer 40. The lower insulating film 232 may be formed of silicon nitride or silicon oxide, and the upper insulating film 234 may be formed of fluorine-containing silicon, to keep the electrical characteristics of the oxide semiconductor layer 40. It is possible to prevent reduction of the hydrogen in the lower insulating film 232 with the oxide semiconductor layer 40 by forming the upper insulating film 234 in a thickness of about 3 nm or more.

A bottom gate structure with the gate electrode disposed under the oxide semiconductor layer was described in the above embodiments, but the present invention is not limited thereto and may be applied to a top gate structure with the gate electrode disposed on the oxide semiconductor layer. A thin film transistor array substrate of a top gate structure according to embodiments of the invention is described hereafter with reference to FIGS. 9 and 10.

Figure 9:
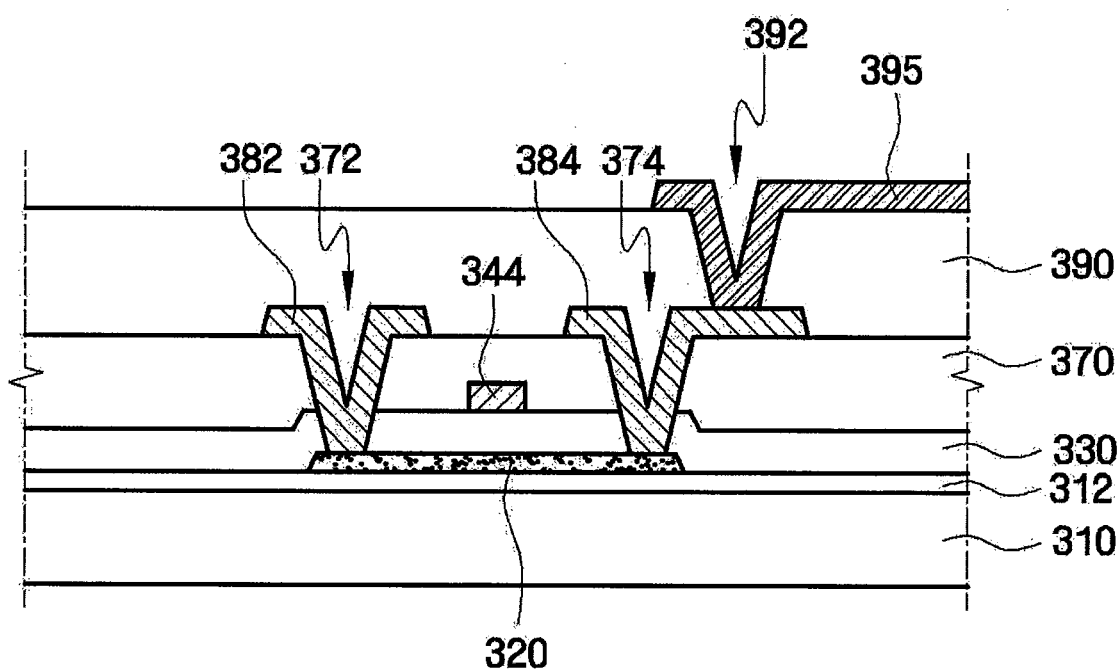
FIG. 9 is a cross-sectional view of a thin film transistor array substrate according to a fourth embodiment of the invention.

A thin film transistor array substrate according to a fourth embodiment of the invention is described in detail with reference to FIG. 9. FIG. 9 is a cross-sectional view of a thin film transistor array substrate according to a fourth embodiment of the invention.

Referring to FIG. 9, a buffer layer 312 of silicon oxide or silicon nitride is formed on an insulating substrate 310. The buffer layer 312, however, may be formed of fluorine-containing silicon to reduce hydrogen that is contained in the buffer layer 312. The buffer layer 312 may not be provided, depending on process conditions.

An oxide semiconductor layer 320 of an oxide of a material selected from Zn, In, Ga, Sn, and their combination is then formed. For example, a composite oxide, such as ZnO, InZnO, InGaO, InSnO, ZnSnO, GaSnO, GaZnO, or GaInZnO, may be used for the oxide semiconductor layer 320.

A gate insulating film 330 is formed on the insulating film 310 and oxide semiconductor layer 320. The gate insulating film 330 may be formed of fluorine-containing silicon. The fluorine-containing silicon may be fluorine-containing silicon nitride, fluorine-containing silicon oxide, or fluorine-containing silicon oxynitride, such as SiOF, SiNF, SiONF, or SiOCF. When the gate insulating film 330 is formed of fluorine-containing silicon, a low level of hydrogen is contained the gate insulating film 330, such that it is possible to prevent deterioration of the electrical characteristics of the oxide semiconductor layer 320.

A gate electrode 344 is formed on the gate insulating film 330, overlapping the oxide semiconductor layer 320.

A first interlayer insulating film 370 is formed on the gate insulating film 330 and gate electrode 344. The first interlayer insulating film 370 may be generally formed of a silicon oxide film, silicon nitride film, or silicon oxynitride film, using chemical vapor deposition. A pair of contact holes 372, 374 exposes a portion of the oxide semiconductor layer 320 and is formed through the first interlayer insulating film 370 and the gate insulating film 330, at both sides of the gate electrode 344, respectively.

A source electrode 382 and a drain electrode 384 that are electrically connected with the oxide semiconductor layer 320 through the contact holes 372, 374 are formed on the first interlayer insulating film 370.

A second interlayer insulating film 390 formed of an organic material having good planarization and photosensitivity is formed on the source electrode 382, drain electrode 384, and first interlayer insulating film 370. For example, the second interlayer insulating film 390 may be formed of an organic material such as acryl resin, using spin coating. A contact hole 392 that exposes the drain electrode 374 is formed in the second interlayer insulating film 390.

A pixel electrode 395 of a transparent material that is electrically connected with the drain electrode 374 through the contact hole 392 is formed on second interlayer insulating film 390.

Figure 10:
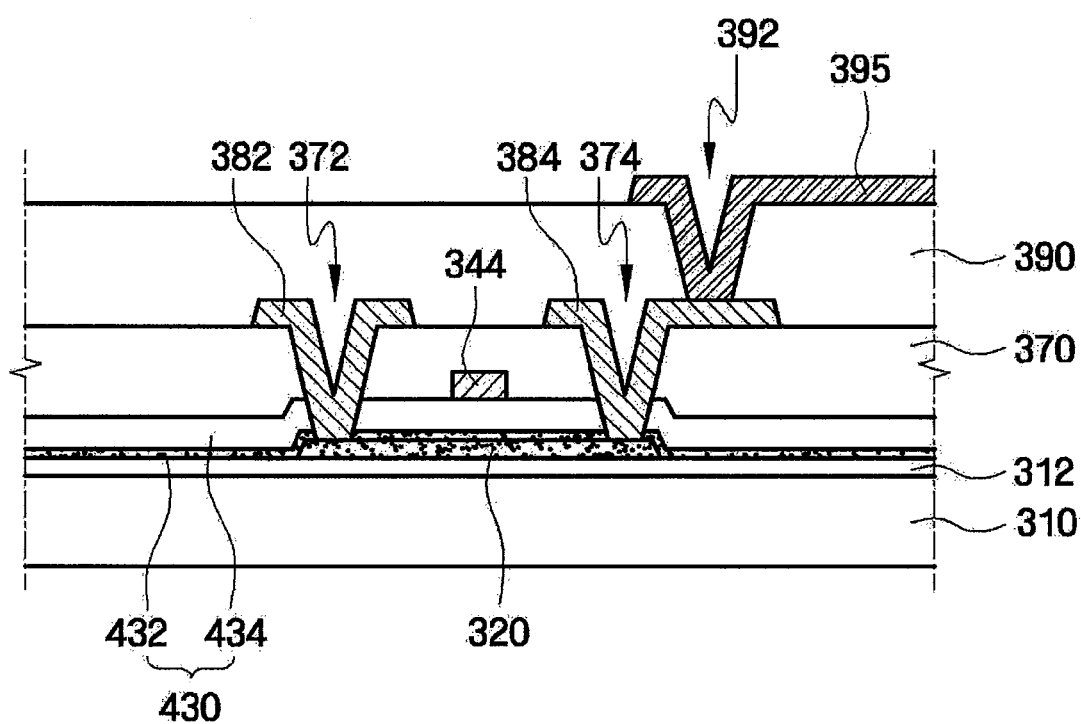
FIG. 10 is a cross-sectional view of a thin film transistor array substrate according to a fifth embodiment of the invention.

A thin film transistor array substrate according to a fifth embodiment of the invention is described with reference to FIG. 10. FIG. 10 is a cross-sectional view of a thin film transistor array substrate according to a fifth embodiment of the invention. For the sake of convenience, components having the same function as the components shown in the figure (FIG. 9) are represented by the same reference numerals, and accordingly are not described.

Referring to FIG. 10, a gate insulating film 430 in this embodiment is composed of two passivation films: a lower insulating film 432 that contacts the oxide semiconductor layer 320, and an upper insulating film 434 that contacts the gate electrode 344 (and does not contact the oxide semiconductor layer 320). The lower insulating film 432 may be formed of fluorine-containing silicon to keep the electrical characteristics of the oxide semiconductor layer 40, and the upper insulating film 434 may be formed of silicon nitride or silicon oxide. It is possible to prevent reduction of the hydrogen in the upper insulating film 434 with the oxide semiconductor layer 320 by forming the lower insulating film 432 in a thickness of about 3 nm or more.

Although the present invention has been described in connection with the exemplary embodiments of the present invention with reference to the accompanying drawings, it will be apparent to those skilled in the art that various modifications and changes may be made thereto without departing from the scope and spirit of the invention. Therefore, it should be understood that the above embodiments are not limitative, but illustrative in all aspects.

What is claimed is:

1. A thin film transistor array substrate comprising:
   an oxide semiconductor layer;
   a gate electrode overlapping the oxide semiconductor layer;
   a gate insulating film disposed between the oxide semiconductor layer and the gate electrode; and
   a passivation film formed on the oxide semiconductor layer and the gate electrode;
   wherein at least one of the gate insulating film and the passivation film contains fluorine-containing silicon.

2. The thin film transistor array substrate of claim 1, wherein the fluorine-containing silicon is fluorine-containing silicon nitride, fluorine-containing silicon oxide, or fluorine-containing silicon oxynitride.

3. The thin film transistor array substrate of claim 2, wherein the fluorine-containing silicon is SiOF, SiNF, SiONF, or SiOCF.

4. The thin film transistor array substrate of claim 1, wherein the passivation film includes:
   a first passivation film formed of fluorine-containing silicon and
   a second passivation film.

5. The thin film transistor array substrate of claim of claim 4, wherein the thickness of the first passivation film is 3 nm or more.

6. The thin film transistor array substrate of claim 1, wherein the gate insulating film includes:
   a first insulating film formed of fluorine-containing silicon and
   a second insulating film.

7. The thin film transistor array substrate of claim 6, wherein the thickness of the first insulating film is 3 nm or more.

8. The thin film transistor array substrate of claim 1, wherein the oxide semiconductor layer is an oxide of a material selected from Zn, In, Ga, Sn, and their combination.

9. The thin film transistor array substrate of claim 1, further comprising a source electrode and a drain electrode formed on the oxide semiconductor layer, wherein and the source electrode and the drain electrode have an upper TiN film and a lower Cu film.

10. A method of manufacturing a thin film transistor array substrate, comprising:
   forming a thin film transistor structure having an oxide semiconductor layer, a gate electrode overlapping the oxide semiconductor layer, and a gate insulating film therebetween; and
   forming a passivation film on the oxide semiconductor layer and the gate electrode;
   wherein at least one of the gate insulating film and the passivation film contains fluorine-containing silicon.

11. The method of claim 10, wherein the forming the at least one of the gate insulating film and a passivation film comprises forming the fluorine-containing silicon by reaction gases without hydrogen.

12. The method of claim 11, wherein the forming the fluorine-containing silicon further comprises forming the fluorine-containing silicon by reacting a first reaction gas containing Si and F with a second reaction gas containing O, N, or F.

13. The method of claim 12, wherein the first reacting gas is at least one of SiF, $SiF_2$, $SiF_3$, and $SiF_4$ and the second reaction gas is at least one of NO, $N_2O$, $O_2$, NF, $NF_2$, and $NF_3$.

14. The method of claim 10, wherein the forming the fluorine-containing silicon further comprises forming the fluorine-containing silicon by reacting a first reaction gas containing fluorine with a second reaction gas containing hydrogen.

15. The method of claim 14, wherein the first reaction gas is at least one of SiF, $SiF_2$, $SiF_3$, and $SiF_4$ and the second reaction gas is at least one of $NH_2$ and $NH_3$.

16. The method of claim 14, wherein the first reaction gas is at least one of NF, $NF_2$, and $NF_3$ and the second reaction gas includes $SiH_4$.

17. The method of claim 10, wherein the fluorine-containing silicon is fluorine-containing silicon nitride, fluorine-containing silicon oxide, or fluorine-containing silicon oxynitride.

18. The method of claim 17, wherein the fluorine-containing silicon is SiOF, SiNF, SiONF, or SiOCF.

19. The method of claim 10, wherein the oxide semiconductor layer is an oxide of a material that is at least one of Zn, In, Ga, and Sn.

20. A thin film transistor array substrate comprising:
   an oxide semiconductor layer;
   a gate electrode overlapping the oxide semiconductor layer;
   a gate insulating film disposed between the oxide semiconductor layer and the gate electrode; and
   a passivation film formed on the oxide semiconductor layer and the gate electrode;
   wherein the gate insulating film and the passivation film contains fluorine-containing silicon.

* * * * *